(12) United States Patent
Sung et al.

(10) Patent No.: US 9,490,209 B2
(45) Date of Patent: Nov. 8, 2016

(54) ELECTRO-MIGRATION BARRIER FOR CU INTERCONNECT

(71) Applicant: Taiwan Semiconductor Manufacturing Co., Ltd., Hsin-Chu (TW)

(72) Inventors: Su-Jen Sung, Zhubei (TW); Chih-Chiang Chang, Zhubei (TW); Chia-Ho Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/967,596

(22) Filed: Aug. 15, 2013

(65) Prior Publication Data
US 2014/0264874 A1   Sep. 18, 2014

Related U.S. Application Data

(60) Provisional application No. 61/778,674, filed on Mar. 13, 2013.

(51) Int. Cl.
*H01L 23/532* (2006.01)
*H01L 21/768* (2006.01)

(52) U.S. Cl.
CPC ... *H01L 23/53238* (2013.01); *H01L 21/76832* (2013.01); *H01L 21/76834* (2013.01); *H01L 21/76849* (2013.01); *H01L 21/76852* (2013.01); *H01L 21/76885* (2013.01); *H01L 23/5329* (2013.01); *H01L 2924/0002* (2013.01)

(58) Field of Classification Search
CPC .............. H01L 23/53238; H01L 23/5329; H01L 23/532
USPC ............................................. 257/751
See application file for complete search history.

(56) References Cited

U.S. PATENT DOCUMENTS

| | | | | |
|---|---|---|---|---|
| 6,020,263 A * | 2/2000 | Shih | ............ | H01L 23/544 216/18 |
| 6,020,273 A * | 2/2000 | Cheng | ............ | H01L 21/316 257/E21.267 |
| 6,083,835 A * | 7/2000 | Shue | ............ | H01L 21/7684 257/E21.583 |
| 6,461,225 B1 * | 10/2002 | Misra | ............ | H01L 21/7684 257/E21.583 |

(Continued)

FOREIGN PATENT DOCUMENTS

JP    5021378 B2    9/2012
KR    20100072321 A    6/2010

OTHER PUBLICATIONS

English translation of Korean Office Action dated Jan. 23, 2015, for copending Korean application No. 10-2013-0152948.
English translation of the first page of Korean Office Action dated Jun. 23, 2015 for co-pending Korean Application No. 10-2013-0152948.

*Primary Examiner* — Peniel M Gumedzoe
(74) *Attorney, Agent, or Firm* — Eschweiler & Associates, LLC

(57) ABSTRACT

Integrated circuit devices and method of forming them. The devices include a dielectric barrier layer formed over a copper-containing metal interconnect structure. The dielectric barrier layer inhibits electro-migration of Cu. The dielectric barrier layer includes a metal-containing layer that forms an interface with the interconnect structure. Incorporating metal within the interfacial layer improves adhesion of the dielectric barrier layer to copper lines and the like and provides superior electro-migration resistance over the operating lifetime of the devices.

20 Claims, 5 Drawing Sheets

(56) References Cited

U.S. PATENT DOCUMENTS

| | | | |
|---|---|---|---|
| 6,566,250 B1* | 5/2003 | Tu et al. ........................ | 438/637 |
| 2005/0087871 A1* | 4/2005 | Abe .............................. | 257/751 |
| 2005/0147762 A1* | 7/2005 | Dubin et al. .................. | 427/437 |
| 2006/0027922 A1* | 2/2006 | Lee et al. ...................... | 257/750 |
| 2007/0257369 A1 | 11/2007 | Huang | |
| 2008/0067679 A1* | 3/2008 | Takagi et al. ................. | 257/751 |
| 2009/0085145 A1 | 4/2009 | Feustel et al. | |
| 2011/0012238 A1 | 1/2011 | Cohen et al. | |

\* cited by examiner

ELECTRO-MIGRATION BARRIER FOR CU INTERCONNECT

CROSS-REFERENCE TO RELATED APPLICATION

This application is a Non-Provisional patent application claiming priority to U.S. Provisional Patent Application Ser. No. 61/778,674 filed with the USPTO on Mar. 13, 2013 in the name of Su-Jen Sung, et al., entitled "Electro-Migration Barrier for Cu Interconnect" and is hereby incorporated in its entirety.

FIELD

The present disclosure relates to integrated circuit devices and methods for manufacturing them.

BACKGROUND

Many years of research have been devoted to reducing the critical dimensions (CDs) and structure densities of integrated circuits (ICs). As densities have increased, the resistance capacitance (RC) delay time has become a limiting factor in circuit performance. RC delay can be reduced by using copper in place of aluminum for metal interconnect structures. RC delay can also be reduced by using low-k or extremely low-k dielectrics.

Electro-migration can cause copper to diffuse into adjacent structures and create voids within copper lines. Electro-migration is typically mitigated using diffusion barriers. Diffusion barriers are generally provided between copper and adjacent structures. A variety of diffusion barrier materials have been used. Examples of conductive barrier materials include compounds of transition metals such as tantalum nitride, titanium nitride, and tungsten nitride. Examples of dielectric diffusion barrier materials include silicon nitride, silicon oxynitride, and silicon carbide.

DETAILED DESCRIPTION

The present disclosure provides integrated circuit devices and methods of forming them. The devices include a dielectric barrier layer formed over a copper-containing metal interconnect structure. The dielectric barrier layer inhibits electro-migration of Cu. The dielectric barrier layer includes a metal-containing layer that forms an interface with the copper-containing metal of the interconnect structure. Incorporating metal within the interfacial layer improves adhesion of the dielectric barrier layer to copper lines and the like and provides superior electro-migration resistance over the operating lifetime of the devices.

Figure 1:
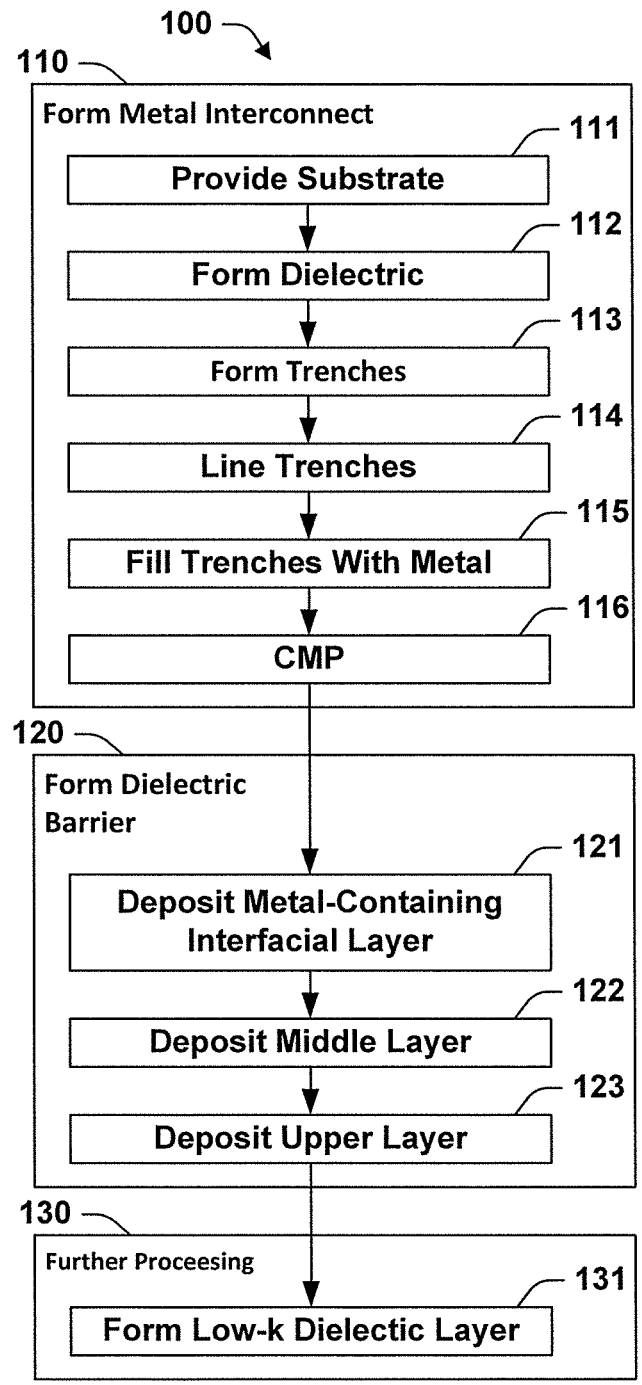
FIG. 1 is a flow chart of an example process according to an embodiment of the present disclosure.

FIG. 1 is a flow chart of an example process 100 according to an embodiment of the present disclosure. The process 100 begins with a series of actions 110 that form a metal interconnect with exposed copper-containing metal. The next series of actions 120 form a dielectric barrier layer over the exposed copper. Additional processing 130 can follow, and typically includes forming structures such as additional metal interconnect layers over the dielectric barrier layer.

Figure 2:
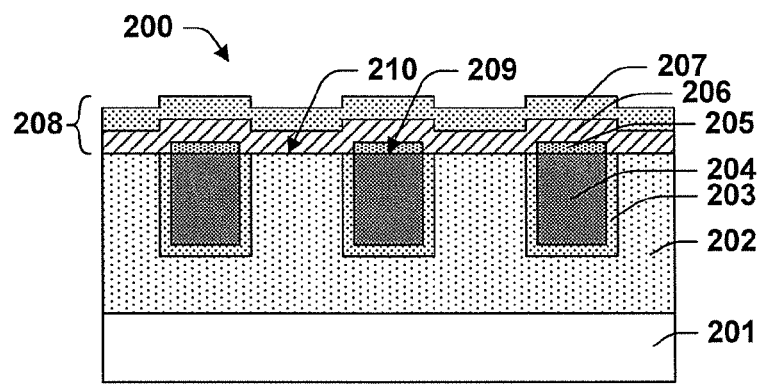
FIG. 2 is a schematic illustration of a semiconductor device according to an embodiment of the present disclosure.

FIG. 2 is a schematic illustration of an integrated circuit device 200, which is an embodiment of the present disclosure and an example of the type of device that can be produced by the process 100. The device 200 includes metal lines 204 formed within a matrix of dielectric 202. The dielectric 202 is formed over a substrate 201. Trench liner 203 provides a barrier between the conductive lines 204 and the dielectric 202. A dielectric barrier layer 208 is formed over the conductive lines 204. The dielectric barrier layer 208 includes a metal-containing interfacial layer 205, a middle layer 206, and an upper layer 207. In some embodiments, the middle layer 206 is not required and is excluded. In some embodiments, neither the middle layer 206 or the upper layer 207 is required, and both are excluded.

Figure 3:
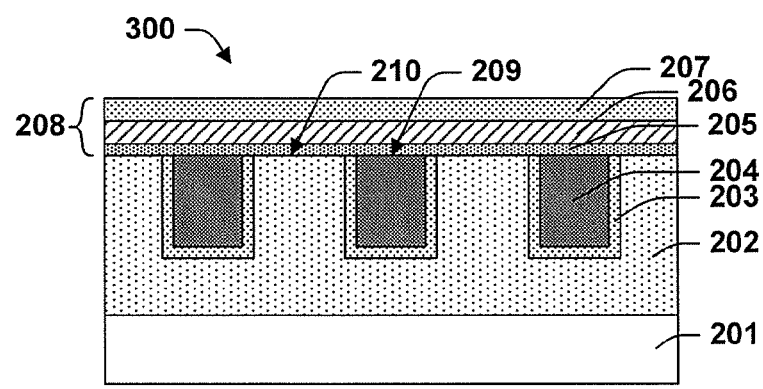
FIG. 3 is a schematic illustration of a semiconductor device according to another embodiment of the present disclosure.

In the device 200, the interfacial layer 205 has been formed by a selective deposition process, whereby the interfacial layer 205 is formed above the upper surface 209 of metal lines 204 but not above the upper surface 210 of dielectric 202. In some embodiments, the interfacial layer 205 is formed by a non-selective deposition process, whereby the interfacial layer 205 is formed above both the upper surface 209 of metal lines 204 and the upper surface 210 of dielectric 202. FIG. 3 is a schematic illustration of a integrated circuit device 300, which is an example of such embodiments.

Figure 4:
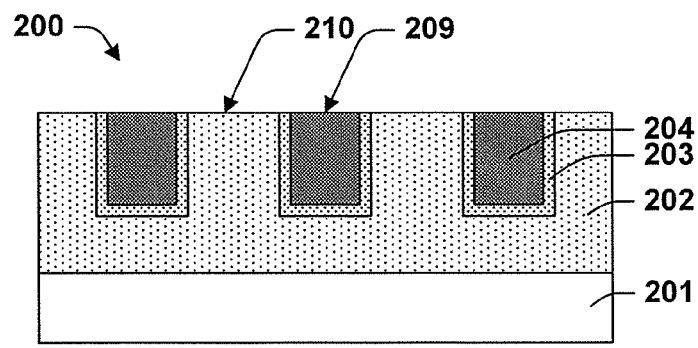
FIG. 4 is a schematic illustration of a semiconductor device including the interconnect structure used in the embodiments of FIGS. 2 and 3.

The metal interconnect can be formed by any suitable process. Suitable processes for forming the metal interconnect include, without limitation, damascene and dual damascene processes. The copper-containing metal 204 may be exposed at an intermediate stage of the damascene or dual damascene process. In the example process 100 illustrated by FIG. 1, the actions 110 that form a metal interconnect with exposed copper-containing metal 204 include: action 111, providing the substrate 201; action 112, forming a layer of dielectric 202 over the substrate 201; action 113, forming trenches within the dielectric 202; action 114, lining the trenches with trench liner 203; action 115, filling the trenches with copper-containing metal 204 to form metal lines; and action 116, planarization such as chemical mechanical polishing 116. FIG. 4 provides an example of the device 200 at this stage of manufacture.

Figure 5:
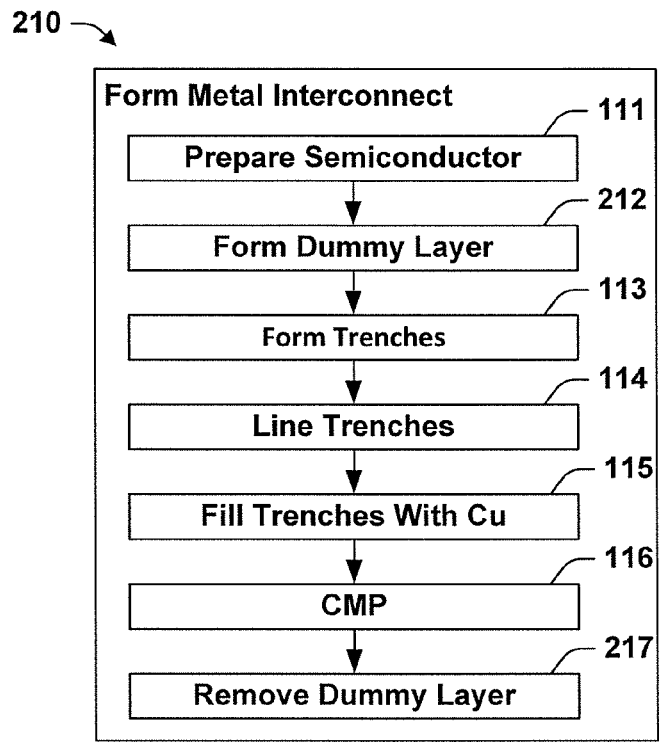
FIG. 5 is a flow chart of an alternate process as used in some other embodiments to form a metal interconnect structure.
Figure 6:
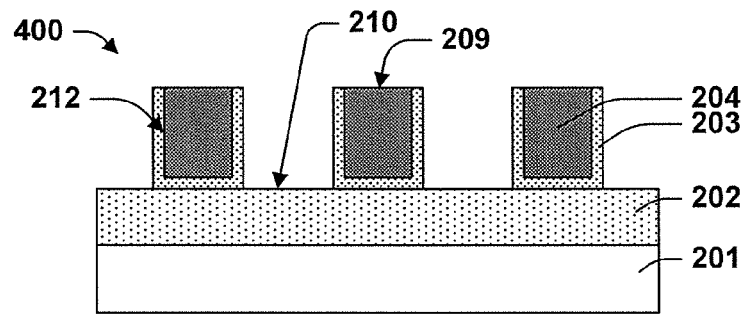
FIG. 6 is a schematic illustration of a semiconductor device including an example interconnect structure formed by the process of FIG. 5.
Figure 7:
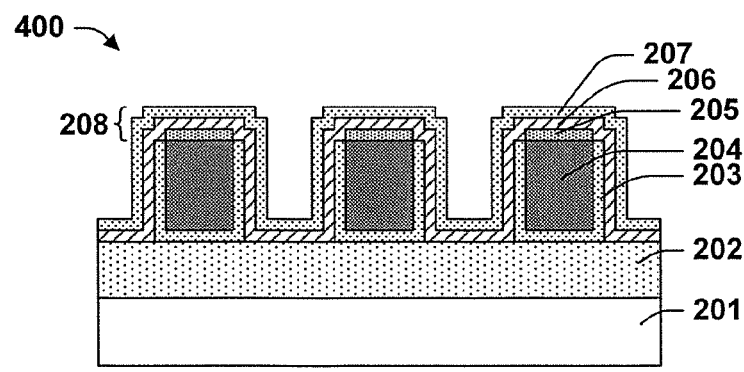
FIG. 7 is a schematic illustration of a semiconductor device according to some embodiments that use the interconnect structure of FIG. 6.
Figure 8:
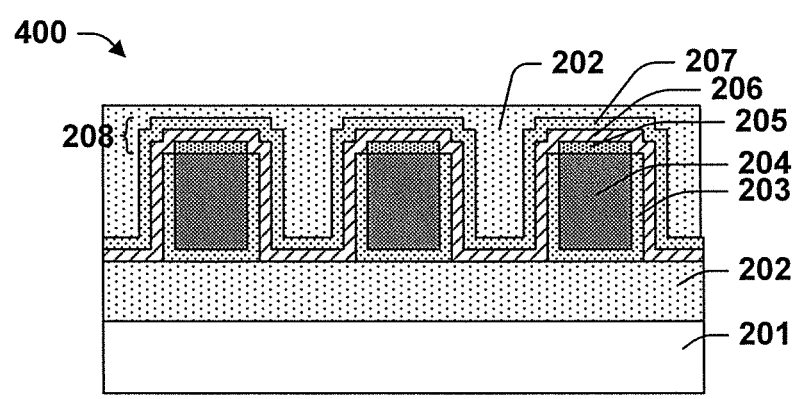
FIG. 8 is a schematic illustration of the semiconductor device of FIG. 7 after further processing.

FIG. 5 provides a flow chart for a process 210, which is another process that can be used for forming the metal interconnect. The process 210 is similar to the process 110 except for action 212, which forms a dummy layer that temporarily takes the place of all or part of the matrix of dielectric 202 within which conductive lines 204 are inlaid. The dummy layer is later removed with action 217. FIG. 6 provides a schematic illustration of a device 400 at the conclusion of process 210. FIG. 7 provides a schematic illustration of the device 400 after applying the process 120 to form the dielectric barrier layer 208. If the dielectric barrier layer 208 includes the upper layer 207 as illustrated in FIG. 7, the dielectric barrier layer 208 for the device 400 forms to the sides 212 as well as above the upper surface 209 of the conductive lines 204. As illustrated by FIG. 8, after further processing 130, the dielectric 202 forms a matrix within which conductive lines 204 are inlaid.

The process 210 of FIG. 5 is illustrative of embodiments in which metal lines 204 are formed before the surrounding matrix of dielectric 202. An advantage of forming the metal lines 204 first is avoiding damage or contamination of the surrounding dielectric 202 during processing that forms the metal lines 204. This can be particularly useful when the dielectric 202 includes an extremely low-k dielectric. Extremely low-k dielectrics are particularly susceptible to such damage or contamination.

Figure 9:
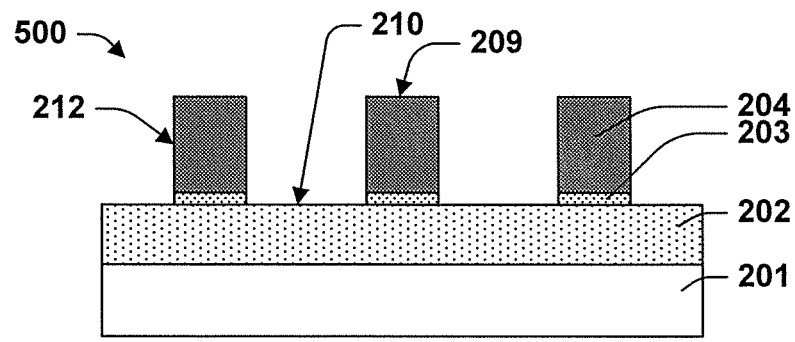
FIG. 9 is a schematic illustration of a semiconductor device including another example interconnect structure.
Figure 10:
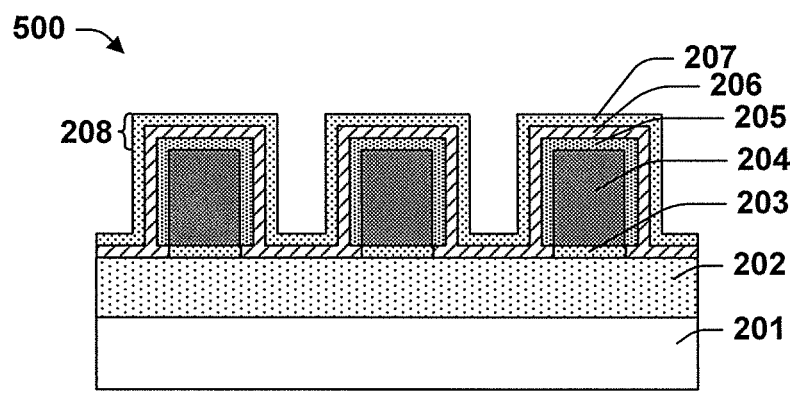
FIG. 10 is a schematic illustration of a semiconductor device according to some embodiments that use the interconnect structure of FIG. 9.
Figure 11:
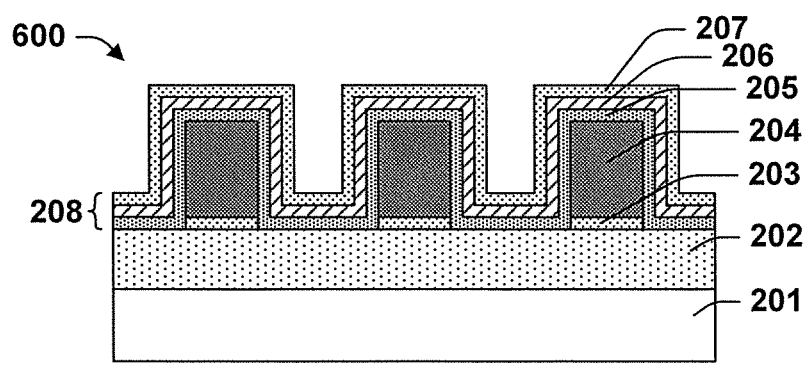
FIG. 11 is a schematic illustration of a semiconductor device according to some other embodiments that use the interconnect structure of FIG. 9.

Some embodiments employ a variation of process 210 in which lining the trenches, action 114, is skipped. FIG. 9 is a schematic illustration of a device 500 that provides an example of the resulting metal interconnect structure formed by this modified process 210. FIG. 10 provides an example of the resulting structure after applying the actions 120 that form the dielectric barrier layer 208 to the device 500 as illustrated in FIG. 9. The device 500 of FIG. 10 illustrates the case in which the interfacial layer 205 is formed by a selective deposition process 121. The device 600 illustrated by FIG. 11 illustrates the case in which the interfacial layer 205 is formed by a non-selective deposition process 121. In either case, the interfacial layer 205 forms to the sides 212 as well as on the upper surface 209 of the conductive lines 204. This can be advantageous when the dielectric barrier layer 208 provides superior resistance to electro-migration as compared to the trench liner 203.

The process 120 of forming the dielectric barrier layer 208 in FIG. 1 begins with action 121, forming the interfacial layer 205. In some embodiments, action 121 is a selective deposition process. In other embodiments, action 121 is a non-selective deposition process. In the present context, selective or non-selective is in relation to the exposed surfaces of copper-containing metal 204. Although the interfacial layer 205 contains metal, the interfacial layer 205 can be a dielectric. When the interfacial layer 205 is deposited by a non-conformal deposition process, a dielectric quality for the interfacial layer 205 is desirable to prevent bridging between conductive lines 204.

The composition of the interfacial layer 205 is selected to provide good adhesion to copper-containing metal lines 204 and stable protection against electro-migration. These properties can be provided by a composition having the formula $M_xO_yN_z$ where M is a metal, O is oxygen, and N is nitrogen. Generally, the metal is selected from the group consisting of Al, Mn, Co, Ti, Ta, W, Ni, Sn, Mg, and combinations thereof. In some embodiments, the interfacial layer 205 is a dielectric, x is in the range from 20 to 70%, y is in the range from 0-80%, z is in the range from 0-80%, and the sum of y and z is at least 30%. In some embodiments in which the interfacial layer 205 is deposited conformally, x is in the range from 40-100%, y is in the range from 0-60%, and z is in the range from 0-60%. Specific examples for the composition of the interfacial layer 205 include Co and AlN.

The thickness of the interfacial layer 205 can be in the range from 5 Å to 100 Å. In embodiments where the dielectric barrier layer 208 does not include the upper layer 207, the thickness is typically in the range from 20 Å to 100 Å. In embodiments where the dielectric barrier layer 208 includes the upper layer 207, the thickness is typically in the range from 5 Å to 50 Å.

The interfacial layer 205 can be formed by any suitable process. Examples of suitable processes for selective deposition of the interfacial layer 205 include, without limitation, electroplating and electroless plating. Examples of suitable processes for non-conformal deposition of the interfacial layer 205 include, without limitation, physical vapor deposition (PVD), chemical vapor deposition (CVD), and sputtering. As a specific example, the interfacial layer 205 can be formed by plasma-enhanced chemical vapor deposition (PECVD).

The process 120 of forming the dielectric barrier layer 208 continues with action 122, forming the middle layer 206. In some embodiments, the middle layer 206 is excluded. In other embodiments, the middle layer 206 is included within the dielectric barrier layer 208 to improve overall performance of the dielectric barrier layer 208 in preventing electro-migration.

The middle layer 206 is a dielectric having a composition selected to provide an effective barrier to the diffusion of copper. Suitable compositions for the middle layer 206 include, for example, SiN, SiC, SiCO and SiCN. The thickness of the middle layer 206 is typically in the range from 10 Å to 200 Å.

The middle layer 206 can be formed by any suitable process. Examples of processes that can be suitable for forming the middle layer 206 include, without limitation, physical vapor deposition (PVD), chemical vapor deposition (CVD), and sputtering. As a specific example, the middle layer 206 can be formed by plasma-enhanced chemical vapor deposition (PECVD).

The process 120 of forming the dielectric barrier layer 208 continues with action 123, forming the upper layer 207. In some embodiments, both the middle layer 206 and the upper layer 207 are excluded. In embodiments that include the middle layer 206, the upper layer 207 is generally superior to the middle layer 206 in terms of suitability for functioning as an etch stop layer. In embodiments that do not include the middle layer 206, and in some other embodiments as well, the upper layer 207 is included within the dielectric barrier layer 208 to improve overall performance of the dielectric barrier layer 208 in preventing electro-migration.

The upper layer 207 is a dielectric. The composition of the upper layer 207 can be selected to provide an effective barrier to the diffusion of copper. The composition of the upper layer 207 can also be selected to provide an etch stop layer for use during further process 130. Suitable compositions for the upper layer 207 include, for example, SiN, SiC, SiCN, SiON, and SiCON. The thickness of the upper layer 207 is typically in the range from 50 Å to 500 Å. As a specific example, the upper layer 207 can be SiCN while the middle layer 206 is SiN.

The upper layer 207 can be formed by any suitable process. Examples of processes that can be suitable for forming the upper layer 207 include, without limitation, physical vapor deposition (PVD), chemical vapor deposition (CVD), and sputtering. As a specific example, the upper layer 207 can be formed by plasma-enhanced chemical vapor deposition (PECVD).

The process 100 continues with further process 130. Further processing can include any steps necessary to complete formation of the device 100. In some embodiments, further processing includes at least action 161, forming a low-k dielectric layer over the dielectric barrier layer 208. This can be the low-k dielectric layer 202 that forms a matrix within which the conductive lines 204 are inlaid or the dielectric matrix for another overlying metal interconnect layer. The dielectric barrier layer 208 can be functional to mitigate electro-migration of copper from conductive lines 204 into the overlying low-k dielectric.

Copper-containing metal 204 can be copper or a conductive copper alloy. In some embodiments, metal 204 is copper as that term is used for copper interconnects in the semiconductor industry. In that context, copper is a metal formed primarily of copper atoms, but can be copper that is alloyed, doped, or otherwise impure.

The substrate 201 can be any suitable substrate. In most embodiments, the substrate 201 includes a semiconductor. Examples of semiconductors include, without limitation, silicon, silicon on insulator (SOI), Ge, SiC, GaAs, GaAlAs, InP, GaN SiGe. In some embodiments, the substrate 201 includes device formed during front-end-of-line processing. Device structures that can be formed during FEOL processing include, without limitation, memory devices, logical devices, FETs and components thereof such as source regions, drain regions, and gate electrodes, active devices, passive devices, and combinations thereof. The substrate 201 can also include insulators, conductors, and interconnect structures, including structures formed during back-end of line (BEOL) processing.

The dielectric layer 202 can include one or more layers of low-k dielectrics. A low-k dielectric is a material having a dielectric constant lower than that of silicon dioxide. Examples of low-k dielectrics include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclobutene, and amorphous polytetrafluoroethylene (PTFE). A low-k dielectric can be applied by any suitable means, including for example, spin coating or CVD.

An extremely low-k dielectric is a material having a dielectric constant of about 2.1 or less. An extremely low-k dielectric can be formed by deposition of a low-k dielectric in such a manner that it has porosity or air-gaps, whereby the effective dielectric constant of the composite including pores and air gaps is 2.1 or less.

The present disclosure describes an integrated circuit device including a substrate, a copper-containing conductive line formed above the substrate, and a dielectric barrier layer above and in contact with the copper-containing conductive line. The dielectric barrier layer includes an interfacial layer that forms the interface between the dielectric barrier layer and the copper-containing conductive line. The interfacial layer has an atomic fraction of metal that is at least 20%.

The present disclosure describes a method of forming an integrated circuit device. The method includes forming a copper-containing conductive line over a substrate and forming a dielectric barrier layer over the copper-containing conductive line. The dielectric barrier layer includes at least a lower layer that is in contact with the copper-containing conductive line. The dielectric barrier layer includes an interfacial layer that forms an interface between the dielectric barrier layer and the copper-containing conductive line. The interfacial layer has an atomic fraction of metal that is at least 20%.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
a substrate;
a plurality of conductive metal interconnect lines arranged within a dielectric material disposed above the substrate;
an interfacial layer in contact with upper surfaces of the plurality of conductive metal interconnect lines, wherein the interfacial layer has an atomic fraction of metal that is at least about 20%;
an upper dielectric layer arranged over the interfacial layer, wherein the upper dielectric layer has a non-planar upper surface having a protrusion overlying the interfacial layer; and
a middle dielectric layer arranged between the upper dielectric layer and the interfacial layer and comprising silicon and carbon or nitrogen.

2. The integrated circuit device of claim 1, wherein the interfacial layer is arranged over the plurality of conductive metal interconnect lines without substantially extending laterally therebetween.

3. The integrated circuit device of claim 1, wherein the interfacial layer covers both the plurality of conductive metal interconnect lines and the dielectric material.

4. The integrated circuit device of claim 1, wherein the interfacial layer has a combined atomic fraction of nitrogen and oxygen of at least about 30%.

5. The integrated circuit device of claim 1, further comprising:
a liner abutting at least one surface of the conductive metal interconnect lines; and
wherein the interfacial layer abuts surfaces of the conductive metal interconnect lines not abutting the liner.

6. The integrated circuit device of claim 1, wherein the upper dielectric layer comprises silicon and carbon, oxygen, or nitrogen.

7. An integrated circuit device, comprising:
a copper-containing conductive line arranged within a low-k dielectric;
an interfacial layer extending over an upper surface of the copper-containing conductive line, the interfacial layer having an atomic fraction of metal that is at least about 20% and combined atomic fraction of nitrogen and oxygen of at least about 30%;
a second dielectric layer overlying the interfacial layer and having a non-planar upper surface with a protrusion above the interfacial layer;
a liner abutting at least one surface of the copper-containing conductive line; and
wherein the interfacial layer abuts surfaces of the copper-containing conductive line not abutting the liner.

8. The integrated circuit device of claim 7, wherein the interfacial layer is located over the copper-containing conductive line, but not over the low-k dielectric.

9. The integrated circuit device of claim 8, wherein the interfacial layer comprises a continuous layer on the upper surface of the copper-containing conductive line and on opposite sidewall surfaces of the copper-containing conductive line.

10. The integrated circuit device of claim 9, wherein the second dielectric layer comprises silicon and carbon, oxygen, or nitrogen, and is laterally located between the interfacial layer and the low-k dielectric.

11. The integrated circuit device of claim 7, further comprising:
a third dielectric layer comprising silicon and carbon, oxygen, or nitrogen, and laterally between the interfacial layer and the low-k dielectric.

12. The integrated circuit device of claim 7, wherein the interfacial layer is located over both the copper-containing conductive line and the low-k dielectric.

13. The integrated circuit device of claim 7, further comprising:
a third dielectric layer abutting an overlying inter-level dielectric (ILD) layer, wherein the second dielectric layer is disposed between the interfacial layer and the third dielectric layer.

14. An integrated circuit device, comprising:
a copper-containing conductive line that is surrounded by a low-k dielectric;
an interfacial layer in contact with an upper surface of the copper-containing conductive line and having an atomic fraction of metal that is at least about 20% and combined atomic fraction of nitrogen and oxygen of at least about 30%; and
a second dielectric layer comprising silicon and carbon, oxygen, or nitrogen, which is located over the interfacial layer and that has a lower surface substantially aligned with a lower surface of a liner abutting sidewalls of the copper-containing conductive line.

15. The integrated circuit device of claim 14, wherein the second dielectric layer has a thickness in a range from about 50 Å to about 500 Å.

16. The integrated circuit device of claim 14, wherein the metal comprises magnesium (Mn), cobalt (Co), tantalum (Ta), nickel (Ni), tin (Sn), or magnesium (Mg).

17. The integrated circuit device of claim 14, wherein the second dielectric layer has a non-planar upper surface with a protrusion above the interfacial layer.

18. The integrated circuit device of claim 14, wherein the interfacial layer has a thickness in the range from about 5 Å to about 100 Å.

19. The integrated circuit device of claim 14, wherein the interfacial layer has a thickness in the range from about 20 Å to about 100 Å.

20. The integrated circuit device of claim 14, wherein the interfacial layer has a thickness in the range from about 5 Å to about 50 Å.

\* \* \* \* \*